(12) United States Patent
Tagaya

(10) Patent No.: US 10,534,242 B2
(45) Date of Patent: Jan. 14, 2020

(54) ELECTRONIC APPARATUS INCLUDING HOLDING STRUCTURE FOR MICRO ELECTRO MECHANICAL SYSTEM (MEMS) MICROPHONE THAT REDUCES SOUND NOISE DUE TO PHOTOELECTRIC EFFECT

(71) Applicant: CANON KABUSHIKI KAISHA, Tokyo (JP)

(72) Inventor: Akira Tagaya, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/162,123

(22) Filed: Oct. 16, 2018

(65) Prior Publication Data
US 2019/0127216 A1    May 2, 2019

(30) Foreign Application Priority Data
Oct. 31, 2017 (JP) .................. 2017-211156

(51) Int. Cl.
| | | |
|---|---|---|
| *G03B 17/08* | (2006.01) | |
| *B81B 7/00* | (2006.01) | |
| *B81B 7/02* | (2006.01) | |
| *H04N 5/225* | (2006.01) | |
| *H04R 1/08* | (2006.01) | |

(52) U.S. Cl.
CPC ............ *G03B 17/08* (2013.01); *B81B 7/0058* (2013.01); *B81B 7/02* (2013.01); *H04N 5/2252* (2013.01); *H04R 1/086* (2013.01); *B81B 2201/0257* (2013.01); *B81B 2207/11* (2013.01); *H04R 2499/11* (2013.01)

(58) Field of Classification Search
CPC ..... G03B 17/08; H04R 1/086; H04R 2499/11
See application file for complete search history.

(56) References Cited

U.S. PATENT DOCUMENTS

| | | | |
|---|---|---|---|
| 9,099,569 B2* | 8/2015 | Lee ......................... | H04R 19/04 |
| 9,386,364 B2* | 7/2016 | Aihara .................... | H04R 1/086 |
| 2013/0129119 A1* | 5/2013 | Miyatake ................ | H04R 19/04 381/176 |
| 2013/0223656 A1* | 8/2013 | Iuchi ....................... | H04R 1/023 381/189 |
| 2017/0351164 A1* | 12/2017 | Kim ........................ | G03B 17/08 |

FOREIGN PATENT DOCUMENTS

| | | |
|---|---|---|
| JP | 2006-186422 A | 7/2006 |
| JP | 2014143674 A | 8/2014 |

* cited by examiner

*Primary Examiner* — Nidhi Thaker
(74) *Attorney, Agent, or Firm* — Canon U.S.A., Inc. IP Division

(57) ABSTRACT

An electronic apparatus includes a housing provided with an opening, a Micro Electro Mechanical System (MEMS) microphone disposed at a position directly under the opening and configured to collect sound through the opening, a light blocking member disposed at a position corresponding to a sound collection unit of the MEMS microphone between the opening and the MEMS microphone to prevent light from entering the MEMS microphone through the opening, and a waterproof member disposed in contact with the light blocking member and configured to close the opening to prevent water from entering the housing through the opening.

9 Claims, 6 Drawing Sheets

ELECTRONIC APPARATUS INCLUDING HOLDING STRUCTURE FOR MICRO ELECTRO MECHANICAL SYSTEM (MEMS) MICROPHONE THAT REDUCES SOUND NOISE DUE TO PHOTOELECTRIC EFFECT

BACKGROUND OF THE DISCLOSURE

Field of the Disclosure

The disclosure relates to an electronic apparatus; and more in particular, holding structures for Micro Electro Mechanical (MEMS) microphones for reducing sound noise due to photoelectric effect.

Description of the Related Art

Recent digital cameras and monitoring cameras include a microphone for detecting and recording sound. Conventionally, an Electret Condenser Microphone (ECM) has been used as a small microphone. However, a Micro Electro Mechanical System (MEMS) microphone is presently being adopted from the viewpoint of the downsizing, power-saving, and digitization of the camera main body. The MEMS microphone including a diaphragm and a fixed film (back plate) is mounted as a compact package on a semiconductor substrate. When the diaphragm vibrates by the sound pressure and the distance between the diaphragm and the fixed film changes, the capacitance of a capacitor changes. Based on this voltage change, the MEMS microphone outputs the sound pressure as an electrical signal. Although the MEMS microphone is said to be resistant to vibration, shock, and thermal change, a microphone holding member is often used to collect sound with higher quality. A camera may include motors and gears for driving a lens and therefore a microphone holding member prevents vibration noise from being transmitted to the microphone. The microphone holding member is used also as a shock absorber for protecting the microphone from shock.

When light hits a semiconductor substrate constituting the MEMS microphone, the number of conduction electrons inside the material increases to increase the electrical conductivity. As a result, a current is generated. This is called a photoelectric effect. Possibly, the current generated due to the photoelectric effect serves as noise which may enter sound collected by the MEMS microphone.

In a microphone holding structure discussed in Japanese Patent Application Laid-Open No. 2006-186422, an opening/closing member for opening and closing a sound collection hole prevents foreign materials from entering the microphone from the outside. As waterproof and dustproof processing, the sound collection hole of the microphone is closed with a breathable transparent membrane having high sound collection performance. However, in a state where the opening/closing member is opened, light passes through the transparent membrane and directly hits the microphone. When a MEMS microphone is used, noise may possibly be recorded in collected sound due to the photoelectric effect.

In a microphone holding s re discussed in Japanese Patent Application Laid-Open No. 2014-143671, an opening of a housing is closed with a dedicated unbreathable filter. To prevent vibration noise from being transmitted to a microphone, a dedicated microphone holding member is used. Although the unbreathable filter prevents light from directly hitting the microphone, the sound collection performance may possibly be degraded since the sound propagation is also blocked.

SUMMARY OF THE INVENTION

The disclosure is directed to an electronic apparatus for reducing sound noise due to the photoelectric effect without degrading the sound collection performance of a MEMS microphone.

According to an aspect of the disclosure, an electronic apparatus includes a housing provided with an opening, a MEMS microphone disposed at a position directly under the opening and configured to collect sound through the opening, a light blocking member disposed at a position corresponding to a sound collection unit of the MEMS microphone between the opening and the MEMS microphone to prevent light from entering the MEMS microphone through the opening, and a waterproof member disposed in contact with the light blocking member and configured to close the opening to prevent water from entering the housing through the opening.

Further features of the disclosure will become apparent from the following description of example embodiments with reference to the attached drawings.

DESCRIPTION OF THE EMBODIMENTS

A first example embodiment of the disclosure will be described below with reference to the accompanying drawings.

As an example of a microphone holding structure, a monitoring camera will be described below.

Figure 1:
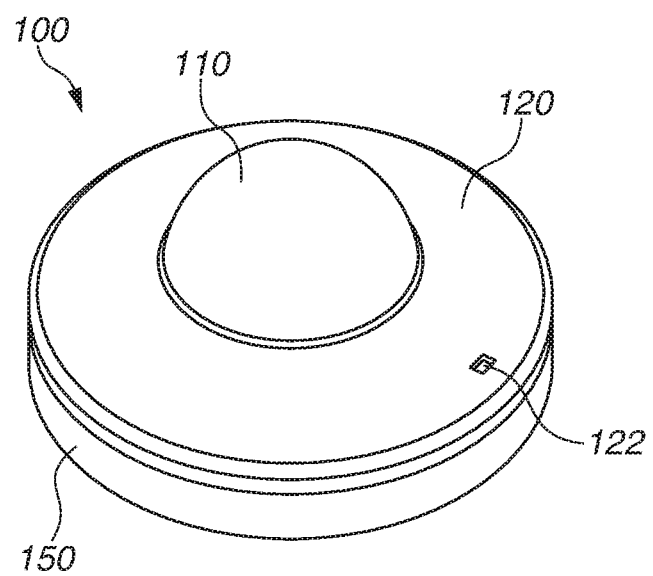
FIG. 1 is a perspective view illustrating an outer appearance of a microphone holding structure according to a first example embodiment of the disclosure.

FIG. 1 is a perspective view illustrating an outer appearance of a microphone holding structure according to the first example embodiment of the disclosure, A monitoring camera 100 is capable of capturing and recording a moving image and detecting and recording sound. The monitoring camera 100 has a housing composed of an upper case 120 and a bottom case 150, The upper case 120 is provided with an opening 122 for collecting sound, Each of the upper case 120 and the bottom case 150 can be manufactured through metal die cast forming and resin molding such as polycarbonate molding. The upper case 120 is provided with a lens protection member 110 and plays a role of protecting stored parts from shock and dust. The lens protection member 110 is formed of, for example, transparent polycarbonate.

Figure 2:
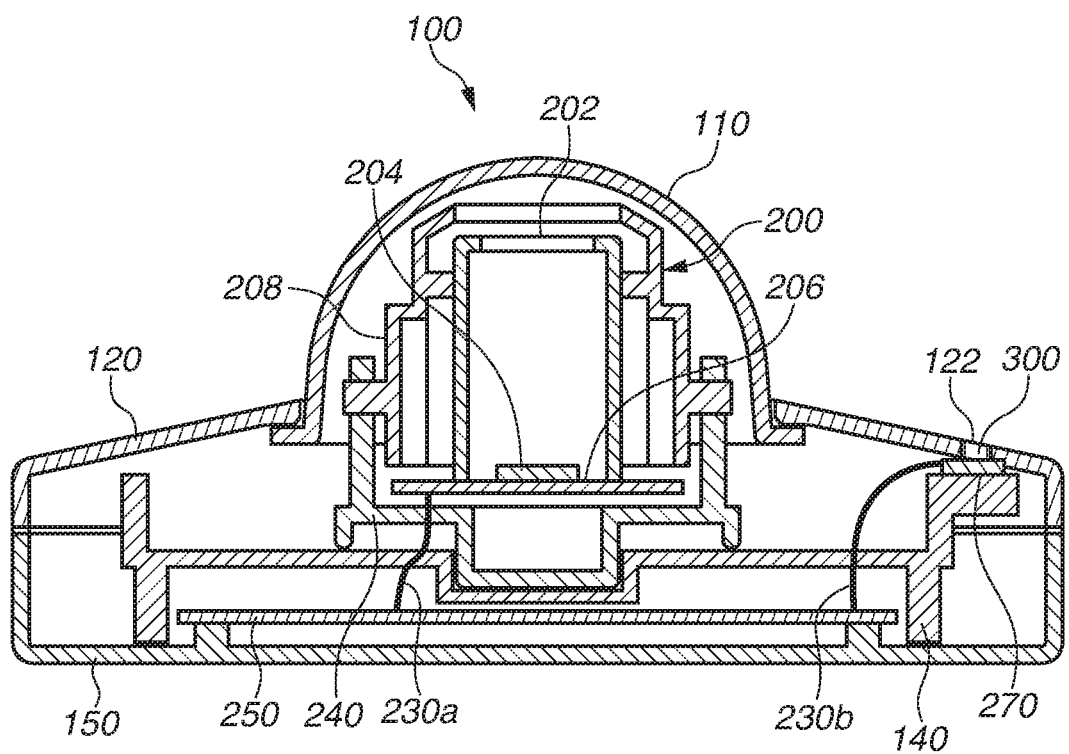
FIG. 2 is a sectional view schematically illustrating a configuration of the microphone holding structure according to the first example embodiment of the disclosure.

FIG. 2 is a sectional view schematically illustrating an example configuration of the microphone holding structure.

The upper case 120 and the bottom case 150 are connected with each other through claw fitting. The lens protection member 110 is fixed to the upper case 120 with an adhesive agent.

The housing accommodates a substrate holding member 140 and a camera unit 200 including a lens 202, an image sensor 204, a lens drive unit, a sensor substrate 206, and a camera housing 208. The housing further accommodates a camera unit holding member 240, a control substrate 250, a microphone substrate 270, and a shock absorber 300 as a first member. The substrate holding member 140 can be manufactured through resin molding such as polycarbonate molding.

The camera unit 200 receives light via the lens protection member 110 and the lens 202 and converts the received light into an electrical signal via the image sensor 204, The image sensor 204 is mounted on the sensor substrate 206 and electrically connected to the control substrate 250 via a wire 230*a*, The image sensor 204 transmits acquired image data to the control substrate 250.

The control substrate 250 bears a function of controlling the entire monitoring camera 100 such as power supply, camera control, and connection to a network. The control substrate 250 is fixed to the bottom case 150 with fixing members such as screws.

Figure 3:
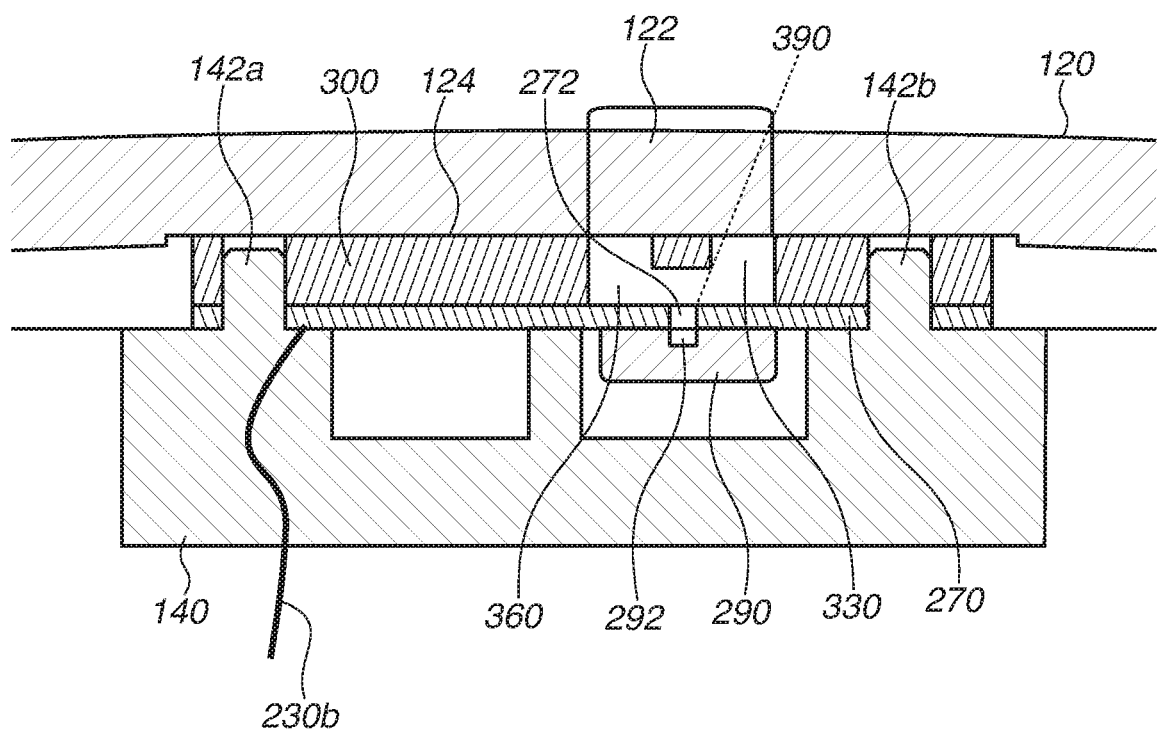
FIG. 3 is a sectional view illustrating a detailed configuration of the microphone holding structure illustrated in FIG. 2.

FIG. 3 is a sectional view illustrating a detailed example configuration of the microphone holding structure. The opening 122 formed in the upper case 120 is structured to allow passage of air, sound, and light between the inside and the outside of the housing. An opening bottom 124 is approximately planar shaped and contacts the shock absorber 300 to prevent noise from entering the housing and reduce shock from the outside.

A MEMS microphone 290 is mounted on the back surface of the microphone substrate 270, The MEMS microphone 290 is provided with a sound collection unit 292, The microphone substrate 270 is electrically connected to the control substrate 250 via a wire 230*b* and fixed to the substrate holding member 140 with screws or tapes.

The MEMS microphone 290 including a diaphragm and a fixed film (back plate) is mounted as a compact package on a semiconductor substrate. When the diaphragm vibrates by the sound pressure, the MEMS microphone 290 as an acoustic component outputs the sound pressure as an electrical signal. The MEMS microphone 290 acquires sound through the opening 122, a sound hole 330 formed in the shock absorber 300, and a hole 272 formed in the microphone substrate 270.

The substrate holding member 140 has approximately cylindrical protruding portions 142*a* and 142*b* for fixing the positions of the microphone substrate 270 and the shock absorber 300.

The shock absorber 300 will be described in detail below.

Figure 4:
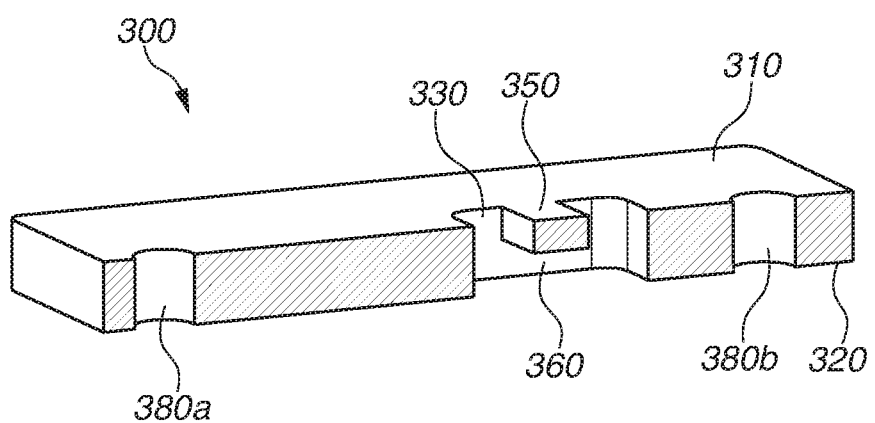
FIG. 4 is a sectional perspective view illustrating a shock absorber according to the first example embodiment of the disclosure.

FIG. 4 is a sectional perspective view illustrating the shock absorber 300.

The shock absorber 300 is an elastic member made of a material which does not transmit light, such as black silicon rubber having an approximately rectangular shape. The shock absorber 300 plays a role of reducing vibration noise from the inside and outside of the housing to improve the signal-to-noise (S/N) ratio of the MEMS microphone 290. The shock absorber 300 has a first surface 310 and a second surface 320, and the first surface 310 is disposed to contact the opening bottom 124 of the housing. The first surface 310 surrounds the opening 122 and plays a role of blocking noise from the inside of the housing to prevent the noise from entering the MEMS microphone 290, The second surface 320 is disposed to contact the microphone substrate 270 to attenuate the vibration to be transmitted to the microphone substrate 270. The shock absorber 300 has positioning holes 380*a* and 380*b* out of the range of the opening 122. When the protruding portions 142*a* and 142*b* of the substrate holding member 140 fit into the positioning holes 380*a* and 380*b*, respectively, from the side of the second surface 320, the position of the shock absorber 300 is determined. This structure makes it possible to prevent the positions of the MEMS microphone 290 and the shock absorber 300 from being shifted, improving the assembling ability and ensuring the suitable sound collection performance.

The shock absorber 300 is provided with a bridge portion 350 which is disposed to divide the sound hole 330, The bridge portion 350 is formed to have a width larger than the width of the opening 122 to block light 390, More specifically, the bridge portion 350 prevents the light 390 that has entered through the opening 122 from passing through the sound collection unit 292 and directly hitting the MEMS microphone 290. The bridge portion 350 is formed to have a thickness smaller than the basic thickness of the shock absorber 300 to provide a sound collection space 360 between the microphone hole 272 and the bridge portion 350. In this way, the bridge portion 350 allows an air passage without closing the sound collection unit 292, thus ensuring the sound collection performance. It is desirable that the bridge portion 350 is thick enough to block light and that the thickness is determined in consideration of moldability.

When light hits the semiconductor substrate which constitutes the MEMS microphone 290, a current is generated due to the photoelectric effect, Possibly, this current serves as noise which may enter sound collected by the MEMS microphone 290.

The present example embodiment provides a structure in which the bridge portion 350 blocks the light that has entered through the opening 122 to prevent the light from passing through the sound collection unit 292 and entering the MEMS microphone 290. In this way, the noise generation due to the photoelectric effect can be reduced. If a bridge portion is provided in the opening 122, the bridge portion needs to be wide because the bridge portion is distant from the MEMS microphone 290. When the opening 122 is divided, the appearance quality may possibly be degraded. In this case, it is desirable to provide a bridge portion on the shock absorber 300 in the vicinity of the MEMS microphone 290.

According to the present example embodiment, it is possible to collect sound with the MEMS microphone 290, block internal sound noise, reduce shock and vibration noise, and block light that has entered through the opening 122. As a result, it becomes possible not only to collect sound with high quality but also to reduce noise caused by the photoelectric effect.

Although, in the present example embodiment, the housing is composed of two parts, it may be composed of three or more parts.

According to the present example embodiment, the upper case 120 and the bottom case 150 may be fixed with screws or an adhesive agent.

Although, in the present example embodiment, the lens protection member 110 is spherical, it may have an aspherical shape or planar shape.

According to the present example embodiment, the lens protection member 110 may be fixed with screws, ultrasonic welding, or other parts.

Although, in the present example embodiment, one control substrate 250 is provided, a plurality of substrates for camera control and power supply management may be provided.

According to the present example embodiment, the control substrate 250 and the sensor substrate 206 may be electrically connected to each other with a flexible substrate or flat cable.

According to the present example embodiment, the microphone substrate 270 may be directly connected to the control substrate 250 with a flexible substrate instead of the wire 230b.

Although, in the present example embodiment, the MEMS microphone 290 is mounted on the back surface of the microphone substrate 270, the MEMS microphone 290 may be mounted on the front surface.

Although, in the present example embodiment, one MEMS microphone 290 is mounted, a plurality of MEMS microphones 290 may be mounted to stereophonically, collect sound and adjust the directivity.

Although, in the present example embodiment, the shock absorber 300 is formed of silicon rubber, the shock absorber 300 may be formed of other elastic materials such as diene-based rubber and thermoplastic elastomer.

Although, in the present example embodiment, the positioning holes 380 and the protruding portions 142 of the substrate holding member 140 are used to determine the position of the shock absorber 300, the outer shape of the shock absorber 300 or a positioning tool may be used.

A second example embodiment of the disclosure will be described below, A monitoring camera may be provided with a waterproof and dustproof structure in consideration of outdoor use. The microphone holding structure according to the second example embodiment of the disclosure differs from the above-described microphone holding structure according to the first example embodiment in the shape of the shock absorber and the parts configuration of the waterproof and dustproof structure.

The following describes the present example embodiment centering mainly on differences from the first example embodiment. Descriptions of similar configurations will be omitted.

Referring to FIG. 1, the upper case 120 is provided with the opening 122 which serves as a sound hole for recording sound and a light emitting hole. The upper case 120 and the bottom case 150 are connected with each other by claw fitting with a packing (not illustrated) sandwiched between them. This structure provides a sealed housing which prevents water and particulates from entering the housing. The lens protection member 110 is fixed to the upper case 120 with an adhesive agent with a two-sided adhesive tape (not illustrated) sandwiched between them. The packing is formed of silicon or urethane foam material and plays a role of preventing water and dust from entering the housing from the outside. The two-sided adhesive tape with, for example, an acrylic pressure-sensitive adhesive agent plays a role of preventing water and dust from entering the housing from the outside.

Figure 5:
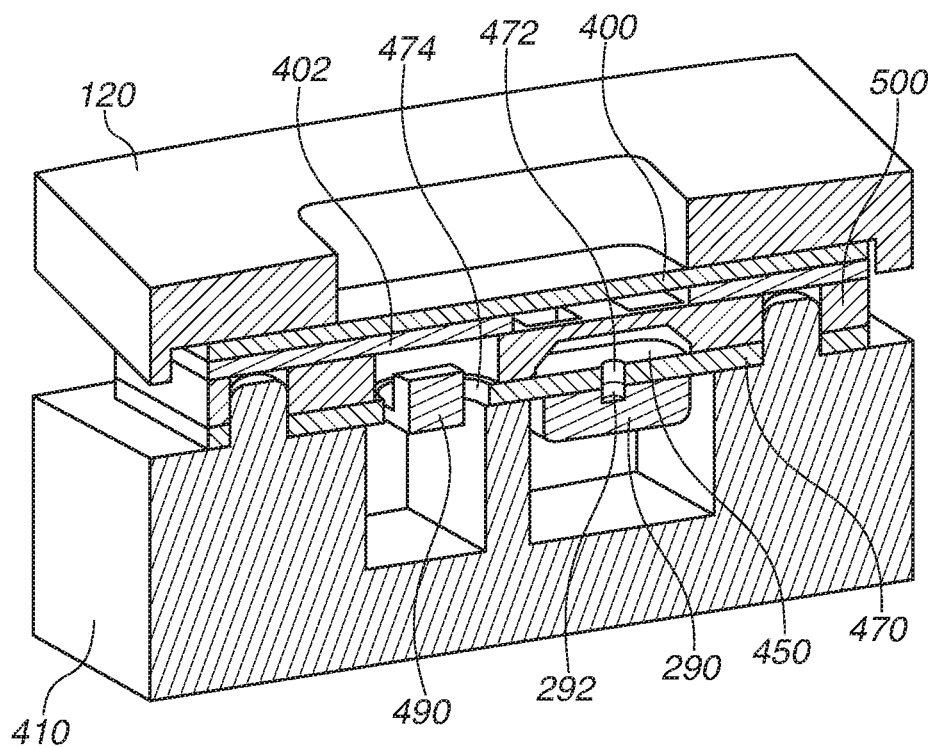
FIG. 5 is a sectional perspective view illustrating a microphone holding structure according to a second example embodiment of the disclosure.

FIG. 5 is a sectional perspective view illustrating a detailed configuration of the microphone holding structure according to the present example embodiment.

A waterproof filter 400 having breathability is disposed so as to close the opening 122 from the inside of the upper case 120. The waterproof filter 400 is formed of, for example, a polytetrafluoroethylene (PTFE) porous membrane to prevent water and dust from entering the housing. Since the waterproof filter 400 has breathability while ensuring the waterproofing performance, the waterproof filter 400 does not degrade the sound collection performance of the MEMS microphone 290.

A transparent support member 402 is stuck on the side face inside the housing of the waterproof filter 400, The support member 402 is formed of, for example, a transparent polyethylene terephthalate (PET) sheet. The support member 402 plays a role of improving the rigidity of the waterproof filter 400 to improve the workability in sticking the waterproof filter 400 to the opening 122. The support member 402 has an air hole for allowing passage of air toward the upper part of the sound hole 530. The support member 402 is pressed onto the housing by a shock absorber 500.

Although the waterproof filter 400 is fixed to the upper case 120 with a two-sided adhesive tape or adhesive agent, screws or claw fitting may be used.

The MEMS microphone 290 and a light emitter 490 are mounted on the side face in the housing of the microphone substrate 470, The microphone substrate 470 with a hole 472 and a light emitter hole 474 formed therein is fixed to a substrate holding member 410 with screws or tapes. Light emitted from the light emitter 490 passes through the support member 402 and the waterproof filter 400 and then is emitted through the opening 122, so that the user is notified of the power source and recording conditions of the camera.

The shock absorber 500 is disposed between the microphone substrate 470 and the waterproof filter 400, A sound collection space 450 is provided between the shock absorber 500 and the microphone hole 472.

Figure 6:
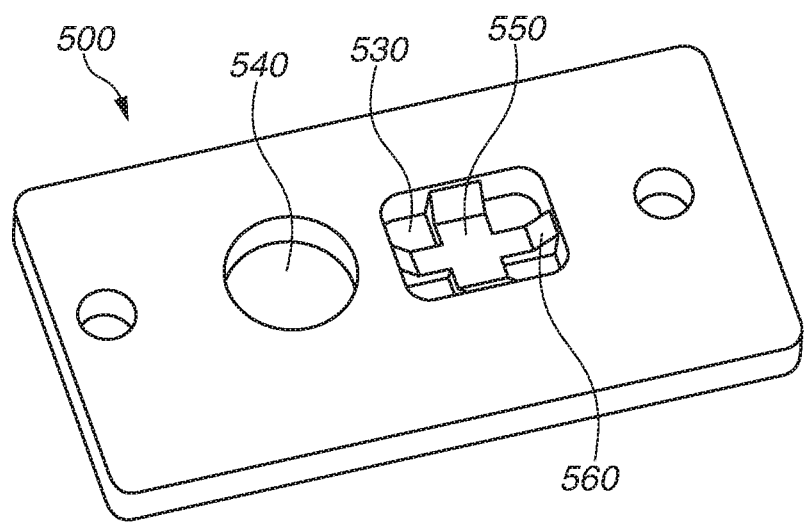
FIG. 6 is a perspective view illustrating the entire back surface of a shock absorber according to the second example embodiment of the disclosure.

FIG. 6 is a perspective view illustrating the entire back surface of the shock absorber 500 according to the second example embodiment of the disclosure.

The shock absorber 500 is formed of a non-transparent elastic member such as silicon rubber having an approximately rectangular shape and plays a role of reducing vibration noise from the inside and outside of the housing to improve the S/N ratio of the MEMS microphone 290. The shock absorber 500 is provided with the sound hole 530 and a light emitter hole 540, The sound hole 530 is provided with a cross-bridge portion 550 protruding within the sound hole 530. The sound collection space 450 is provided between the cross-bridge portion 550 and the microphone hole 472. Since the sound hole 530 and the light emitter hole 540 are separately formed, the light from the light emitter 490 does not enter the MEMS microphone 290.

The cross-bridge portion 550 is formed to have a width larger than the opening width of the sound collection unit 292. The cross-bridge portion 550 is wide enough to block light that has entered through the opening 122. More specifically, the cross-bridge portion 550 prevents the light from passing through the waterproof filter 400 and the air hole of the support member 402 and hitting the MEMS microphone 290 from the sound collection unit 292. The cross-bridge portion 550 is formed to have a thickness smaller than the basic thickness of the shock absorber 500.

The cross-bridge portion 550 is provided with reinforcing ribs 560 at the root thereof. Since the bridge portion 550 is cross-shaped, many supporting points improve the rigidity of the entire bridge portion 550, The reinforcing ribs 560 prevent the distortion of the bridge portion 550. When enlarging the sound hole 530 to further improve the sound collection performance, light can be stably blocked by restraining the distortion of the bridge portion 550. This makes it possible to prevent sound noise resulting from the photoelectric effect even if a camera is installed in a strong rainstorm environment. The reinforcing ribs 560 reinforce only the root of the cross-bridge portion 550 so that the sound collection space 450 is allocated to prevent the degradation of the sound collection performance of the MEMS microphone 290.

When the waterproof and dustproof performance is considered, since the waterproof filter 400 is formed of a thin film sheet, the camera may possibly be damaged by an object flying from the outside. As a result, the waterproof and dustproof performance may not be satisfied. The present example embodiment provides a structure in which, when the waterproof filter 400 is applied with an external force and bends inwardly in the housing, the waterproof filter 400 contacts the cross-bridge portion 550, The inside of the waterproof filter 400 is supported by the cross-bridge portion 550 so that the excessive distortion and damage on the waterproof filter 400 can be prevented. As a result, the reliability of the waterproof and dustproof performance can be improved.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No, 2017-211156, filed Oct. 31, 2017, which is hereby incorporated by reference herein in its entirety.

What is claimed is:

1. An electronic apparatus, comprising:
   a housing provided with an opening;
   a Micro Electro Mechanical System (MEMS) microphone disposed at a position directly under the opening and configured to collect sound through the opening;
   a light blocking member disposed at a position corresponding to a sound collection unit of the MEMS microphone between the opening and the MEMS microphone to prevent light from entering the MEMS microphone through the opening; and
   a waterproof member disposed in contact with the light blocking member and configured to close the opening to prevent water from entering the housing through the opening.

2. The electronic apparatus according to claim 1, wherein the light blocking member is disposed to divide the opening.

3. The electronic apparatus according to claim 1, wherein the light blocking member is formed to have a width larger than an opening width of the sound collection unit of the MEMS microphone.

4. The electronic apparatus according to claim 1, further comprising a substrate on which the MEMS microphone is disposed,
   wherein the substrate is disposed between the MEMS microphone and the light blocking member and provided with a substrate sound collection unit for collecting sound.

5. The electronic apparatus according to claim 4, wherein the light blocking member is formed to have a width larger than an opening width of the substrate sound collection unit.

6. The electronic apparatus according to claim 4, wherein the substrate includes a light emitter mounted thereon.

7. The electronic apparatus according to claim 6, wherein the light blocking member is provided with a light emitting hole for allowing passage of light emitted from the light emitter.

8. The electronic apparatus according to claim 1, wherein the light blocking member is provided with a reinforcing rib.

9. The electronic apparatus according to claim 1, further comprising a camera unit having a lens and an image sensor, wherein the camera unit is movable in a pan/tilt direction.

* * * * *